(12) United States Patent
Newman et al.

(10) Patent No.: US 9,575,481 B2
(45) Date of Patent: Feb. 21, 2017

(54) FASCIA PANEL ASSEMBLY HAVING CAPACITANCE SENSOR OPERATIVE FOR DETECTING OBJECTS

(75) Inventors: Todd R. Newman, Traverse City, MI (US); John M. Washeleski, Cadillac, MI (US); Andrew E. Blank, Cadillac, MI (US); David W. Shank, Hersey, MI (US); Edward J. Cox, II, Marion, MI (US)

(73) Assignee: UUSI, LLC, Reed City, MI (US)

( * ) Notice: Subject to any disclaimer, the term of this patent is extended or adjusted under 35 U.S.C. 154(b) by 897 days.

(21) Appl. No.: 13/084,611

(22) Filed: Apr. 12, 2011

(65) Prior Publication Data

US 2011/0187492 A1    Aug. 4, 2011

Related U.S. Application Data

(63) Continuation-in-part of application No. 12/942,294, filed on Nov. 9, 2010, which is a continuation-in-part of application No. 12/784,010, filed on May 20, 2010, which is a continuation-in-part of application No. 12/545,178, filed on Aug. 21, 2009.

(51) Int. Cl.
*G05B 19/00* (2006.01)
*E05F 15/20* (2006.01)

(52) U.S. Cl.
CPC .................................. *G05B 19/00* (2013.01)

(58) Field of Classification Search
USPC ....................................................... 340/5.72
See application file for complete search history.

(56) References Cited

U.S. PATENT DOCUMENTS

| 2,476,111 | A | 7/1949 | Opalek |
| 3,830,018 | A | 8/1974 | Arai et al. |
| 3,855,733 | A | 12/1974 | Miller |
| 4,178,621 | A | 12/1979 | Simonelic et al. |
| 4,410,843 | A | 10/1983 | Sauer et al. |
| 4,422,521 | A | 12/1983 | Mochida |
| 4,933,807 | A | 6/1990 | Duncan |

(Continued)

FOREIGN PATENT DOCUMENTS

| CN | CN 201158356 Y | 12/2008 |
| DE | 10 2006 009 998 A1 | 9/2007 |

(Continued)

OTHER PUBLICATIONS

International Searching Authority, International Search Report and the Written Opinion for PCT/ US2010/045729 mailed Oct. 6, 2010.

(Continued)

*Primary Examiner* — Fekadeselassie Girma
*Assistant Examiner* — Cal Eustaquio
(74) *Attorney, Agent, or Firm* — Howard & Howard Attorneys PLLC

(57) ABSTRACT

A fascia panel assembly includes an electrically non-conductive fascia panel, an electrically non-conductive isolator, and a capacitance sensor. The sensor capacitively couples to an electrically conductive object proximal to the sensor while the sensor is driven with an electrical charge such that capacitance of the sensor changes due to the sensor capacitively coupling with the object. The isolator is sandwiched between the fascia panel and the isolator.

19 Claims, 9 Drawing Sheets

(56) References Cited

U.S. PATENT DOCUMENTS

| | | | |
|---|---|---|---|
| 5,361,018 A * | 11/1994 | Milton | 315/248 |
| 5,394,292 A | 2/1995 | Hayashida | |
| 5,493,277 A * | 2/1996 | Pierce et al. | 340/620 |
| 5,621,290 A | 4/1997 | Heller et al. | |
| 5,730,165 A | 3/1998 | Philipp | |
| 5,801,340 A | 9/1998 | Peter | |
| 5,952,801 A | 9/1999 | Boisvert et al. | |
| 5,959,538 A * | 9/1999 | Schousek | 340/665 |
| 6,185,872 B1 * | 2/2001 | Seeberger et al. | 49/502 |
| 6,188,228 B1 | 2/2001 | Philipp | |
| 6,233,872 B1 | 5/2001 | Glagow et al. | |
| 6,337,549 B1 | 1/2002 | Bledin | |
| 6,340,199 B1 | 1/2002 | Fukumoto et al. | |
| 6,377,009 B1 | 4/2002 | Philipp | |
| 6,389,752 B1 | 5/2002 | Rosenau | |
| 6,404,158 B1 | 6/2002 | Boisvert et al. | |
| 6,431,638 B1 | 8/2002 | Mrozowski et al. | |
| 6,498,214 B2 | 12/2002 | Laughner et al. | |
| 6,499,359 B1 | 12/2002 | Washeleski et al. | |
| 6,555,982 B2 | 4/2003 | Tyckowski | |
| 6,700,393 B2 | 3/2004 | Haag et al. | |
| 6,723,933 B2 | 4/2004 | Haag et al. | |
| 6,782,759 B2 | 8/2004 | Shank et al. | |
| 6,933,831 B2 | 8/2005 | Ieda et al. | |
| 6,936,986 B2 | 8/2005 | Nuber | |
| 6,946,853 B2 | 9/2005 | Gifford et al. | |
| 6,968,746 B2 | 11/2005 | Shank et al. | |
| 6,980,095 B2 | 12/2005 | Wright et al. | |
| 7,015,666 B2 | 3/2006 | Staus | |
| 7,038,414 B2 | 5/2006 | Daniels et al. | |
| 7,055,885 B2 | 6/2006 | Ishihara et al. | |
| 7,116,117 B2 | 10/2006 | Nakano et al. | |
| 7,126,453 B2 | 10/2006 | Sandau et al. | |
| 7,132,642 B2 | 11/2006 | Shank et al. | |
| 7,152,907 B2 | 12/2006 | Salhoff et al. | |
| 7,162,928 B2 | 1/2007 | Shank et al. | |
| 7,219,945 B1 | 5/2007 | Zinn et al. | |
| 7,260,454 B2 | 8/2007 | Pickering et al. | |
| 7,293,467 B2 | 11/2007 | Shank et al. | |
| 7,312,591 B2 | 12/2007 | Washeleski et al. | |
| 7,342,373 B2 | 3/2008 | Newman et al. | |
| 7,354,097 B2 | 4/2008 | Jackson et al. | |
| 7,375,299 B1 | 5/2008 | Pudney | |
| 7,424,347 B2 | 9/2008 | Babala et al. | |
| 7,424,377 B2 | 9/2008 | Hamilton et al. | |
| 7,449,852 B2 | 11/2008 | Washeleski et al. | |
| 7,513,166 B2 | 4/2009 | Shank et al. | |
| 7,518,327 B2 | 4/2009 | Newman et al. | |
| 7,525,062 B2 | 4/2009 | Adam et al. | |
| 7,538,672 B2 | 5/2009 | Lockyer et al. | |
| 7,547,058 B2 | 6/2009 | King et al. | |
| 7,548,809 B2 | 6/2009 | Westerhoff | |
| 7,576,631 B1 * | 8/2009 | Bingle et al. | 340/5.54 |
| 7,706,046 B2 | 4/2010 | Bauer et al. | |
| 7,733,332 B2 | 6/2010 | Steenwyk et al. | |
| 7,812,721 B2 | 10/2010 | Hoshina et al. | |
| 7,893,831 B2 | 2/2011 | Hoshina et al. | |
| 7,976,749 B2 | 7/2011 | Volkel et al. | |
| 8,033,052 B2 | 10/2011 | Kraus et al. | |
| 8,154,418 B2 | 4/2012 | Peterson et al. | |
| 8,321,174 B1 | 11/2012 | Moyal et al. | |
| 8,589,033 B2 | 11/2013 | Rafii et al. | |
| 8,635,809 B2 | 1/2014 | Wuerstlein et al. | |
| 9,199,608 B2 | 12/2015 | Newman et al. | |
| 2001/0026244 A1 * | 10/2001 | Ieda et al. | 343/867 |
| 2001/0052839 A1 | 12/2001 | Nahata et al. | |
| 2002/0125994 A1 | 9/2002 | Sandau et al. | |
| 2003/0216817 A1 | 11/2003 | Pudney | |
| 2004/0124662 A1 | 7/2004 | Cleland et al. | |
| 2004/0140045 A1 | 7/2004 | Burgess et al. | |
| 2004/0233677 A1 | 11/2004 | Su et al. | |
| 2005/0073852 A1 | 4/2005 | Ward | |
| 2005/0090946 A1 | 4/2005 | Pickering et al. | |
| 2005/0092097 A1 | 5/2005 | Shank et al. | |
| 2006/0026521 A1 | 2/2006 | Hotelling et al. | |
| 2006/0145825 A1 | 7/2006 | McCall | |
| 2006/0177212 A1 | 8/2006 | Lamborghini et al. | |
| 2007/0089527 A1 | 4/2007 | Shank et al. | |
| 2007/0096904 A1 | 5/2007 | Lockyer et al. | |
| 2007/0171057 A1 * | 7/2007 | Ogino et al. | 340/545.7 |
| 2007/0195542 A1 | 8/2007 | Metros et al. | |
| 2007/0276550 A1 | 11/2007 | Desai et al. | |
| 2007/0296242 A1 | 12/2007 | Frommer et al. | |
| 2008/0024451 A1 * | 1/2008 | Aimi et al. | 345/168 |
| 2008/0142593 A1 | 6/2008 | Walsh et al. | |
| 2008/0202912 A1 | 8/2008 | Boddie et al. | |
| 2009/0000196 A1 | 1/2009 | Kollar et al. | |
| 2009/0044449 A1 | 2/2009 | Appel et al. | |
| 2009/0219134 A1 | 9/2009 | Nakasato et al. | |
| 2009/0243824 A1 | 10/2009 | Peterson et al. | |
| 2010/0024301 A1 | 2/2010 | Wuerstlein et al. | |
| 2010/0079387 A1 | 4/2010 | Rosenblatt et al. | |
| 2010/0096193 A1 | 4/2010 | Yilmaz et al. | |
| 2010/0097469 A1 | 4/2010 | Blank et al. | |
| 2010/0287837 A1 | 11/2010 | Wuerstlein et al. | |
| 2011/0001550 A1 | 1/2011 | Schoen | |
| 2011/0041409 A1 | 2/2011 | Newman et al. | |
| 2011/0043325 A1 | 2/2011 | Newman et al. | |
| 2011/0057773 A1 | 3/2011 | Newman et al. | |
| 2011/0187492 A1 | 8/2011 | Newman et al. | |
| 2011/0313619 A1 | 12/2011 | Washeleski et al. | |
| 2012/0182141 A1 | 7/2012 | Peterson et al. | |
| 2012/0192489 A1 | 8/2012 | Pribisic | |
| 2012/0219935 A1 | 8/2012 | Stebbings et al. | |
| 2015/0267453 A1 | 9/2015 | Matsumoto et al. | |

FOREIGN PATENT DOCUMENTS

| | | |
|---|---|---|
| EP | 1 991 751 A1 | 11/2008 |
| WO | WO 89/08952 A1 | 9/1989 |
| WO | 0212669 | 2/2002 |
| WO | 03038220 | 5/2003 |
| WO | WO 2007/098746 A1 | 9/2007 |

OTHER PUBLICATIONS

International Preliminary Examining Authority, International Preliminary Report on Patentability for the corresponding PCT Application No. PCT/US2010/45729 mailed Jan. 20, 2012.

English language abstract and machine-assisted English translation for CN 201158356 extracted from espacenet.com database on May 12, 2016, 8 pages.

Machine-assisted English language abstract for DE 10 2006 009 998 extracted from espacenet.com database on May 12, 2016, 3 pages (see also English language equivalent U.S. Pat. No. 2009/0044449 previously submitted on Apr. 22, 2016).

English language abstract not found for EP 1 991 751; however, see U.S. Pat. No. 2009/0044449—English language equivalent of corresponding WO 2007/098746. U.S. Pat. No. 2009/0044449 was previously submitted on Apr. 22, 2016.

English language abstract and machine-assisted English translation for WO 89/08952 extracted from espacenet.com database on May 12, 2016, 9 pages.

English language abstract for WO 2007/098746 extracted from espacenet.com database on May 12, 2016, 1 page.

Non-Final Office Action mailed Jun. 17, 2016 for Utility U.S. Appl. No. 13/221,167.

* cited by examiner

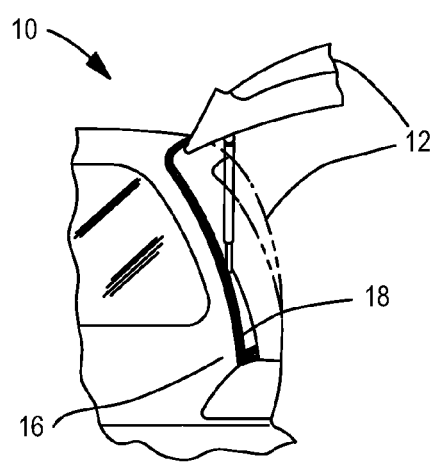
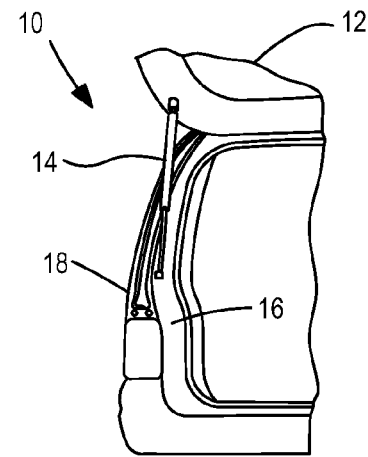
FIG. 1A
FIG. 1B
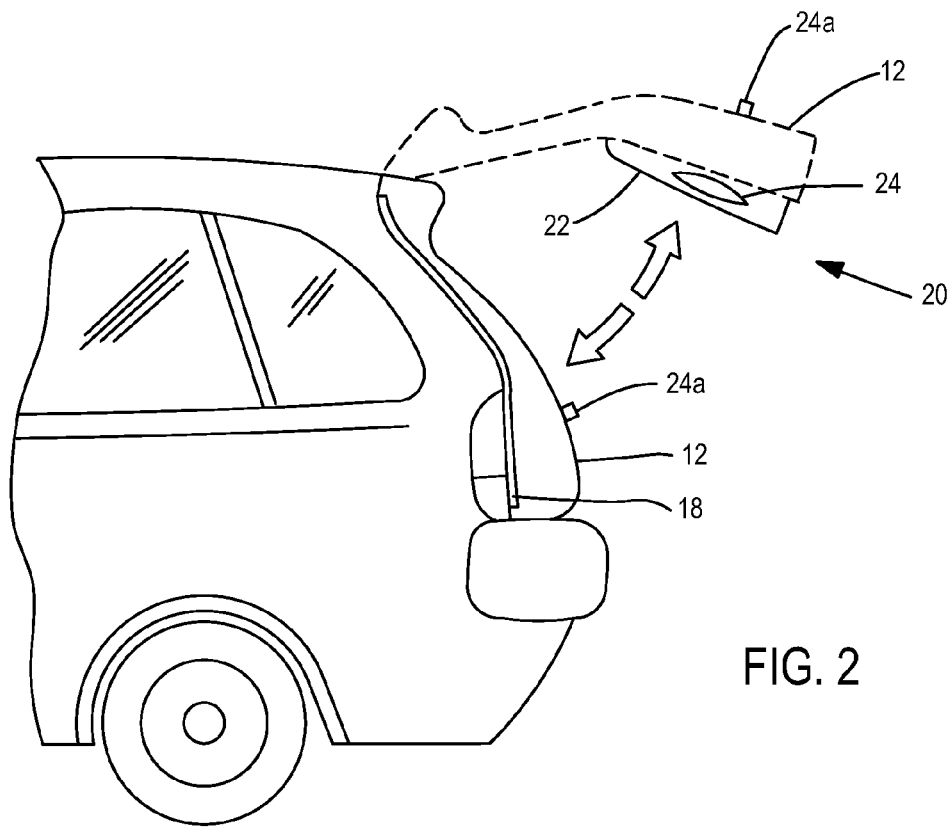
FIG. 2

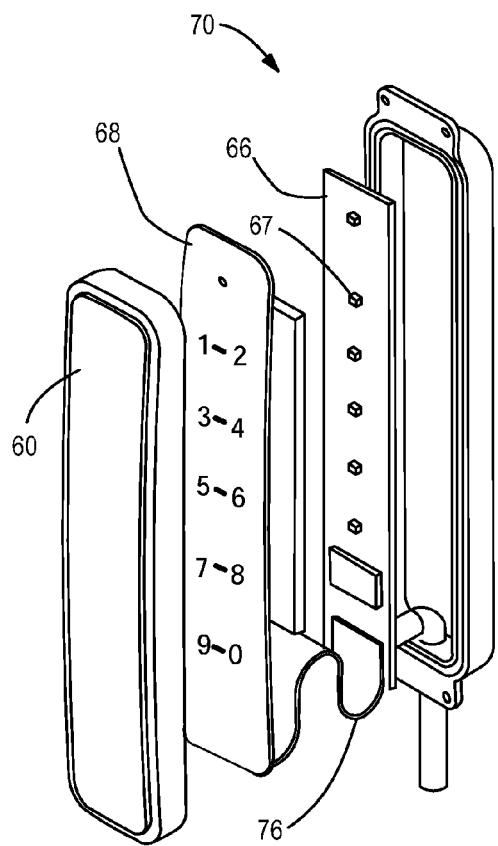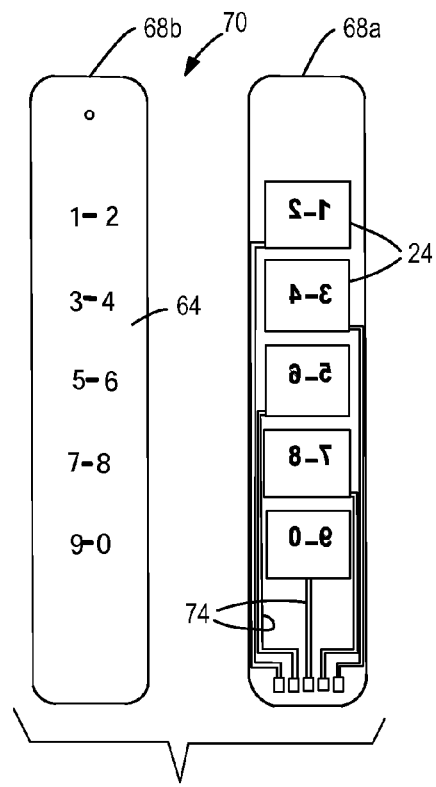
FIG. 7A
FIG. 7B
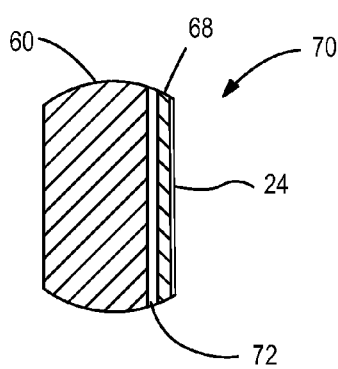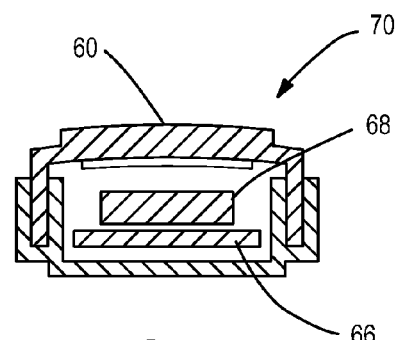
FIG. 7C
FIG. 7D

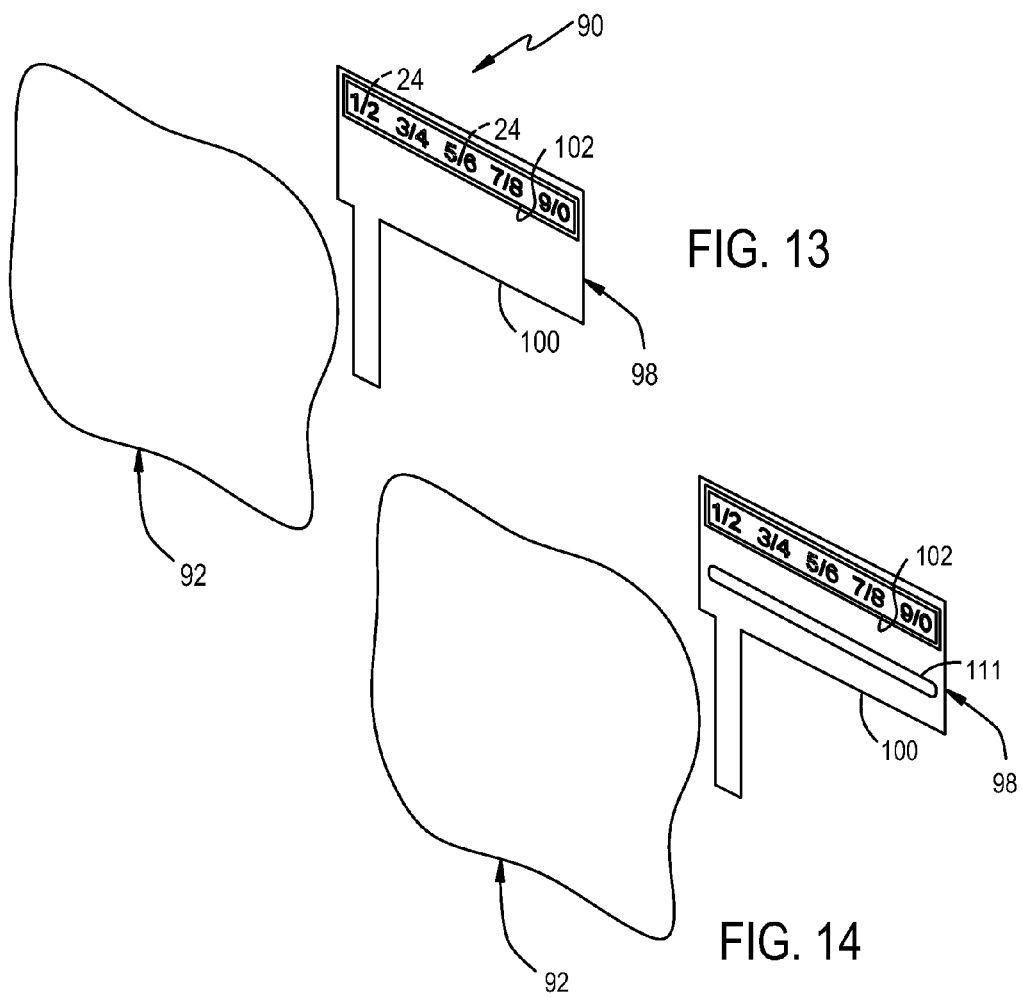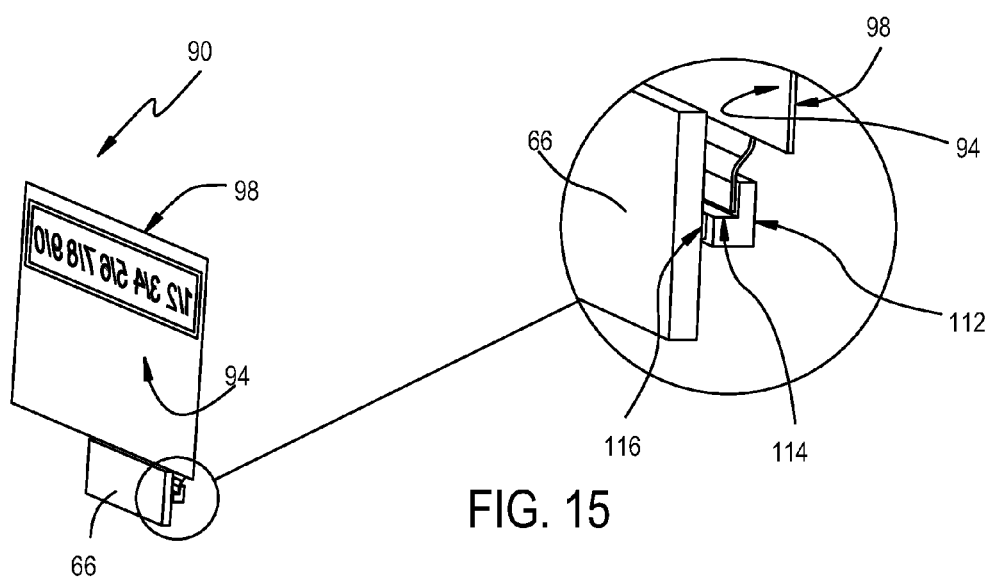

FASCIA PANEL ASSEMBLY HAVING CAPACITANCE SENSOR OPERATIVE FOR DETECTING OBJECTS

CROSS-REFERENCE TO RELATED APPLICATIONS

This application is a continuation-in-part of U.S. application Ser. No. 12/942,294, filed Nov. 9, 2010; which is a continuation-in-part of U.S. application Ser. No. 12/784,010, filed May 20, 2010; which is a continuation-in-part of U.S. application Ser. No. 12/545,178, filed Aug. 21, 2009; the disclosures of which are hereby incorporated by reference.

U.S. Pat. Nos. 7,513,166 and 7,342,373 are also hereby incorporated by reference.

BACKGROUND OF THE INVENTION

Field of the Invention

The present invention relates to fascia panel assemblies for vehicles.

SUMMARY OF THE INVENTION

An object of the present invention is a fascia panel assembly having a capacitance sensor and a controller in which the sensor detects an object in proximity with or touching a vehicle opening such as a door, trunk, hatch, or the like and the controller controls the vehicle opening based on detection of the object.

In carrying out the above object and other objects, the present invention provides an assembly having an electrically non-conductive isolator and a capacitance sensor. The isolator is mountable to a fascia panel. The sensor is attached to the isolator. The sensor capacitively couples to an electrically conductive object proximal to the sensor while the sensor is driven with an electrical charge such that capacitance of the sensor changes due to the sensor capacitively coupling with the object.

Further, in carrying out the above object and other objects, the present invention provides a fascia panel assembly having an electrically non-conductive fascia panel, an electrically non-conductive isolator, and a capacitance sensor. The sensor capacitively couples to an electrically conductive object proximal to the sensor while the sensor is driven with an electrical charge such that capacitance of the sensor changes due to the sensor capacitively coupling with the object. The isolator is sandwiched between the fascia panel and the isolator.

The above features, and other features and advantages of the present invention are readily apparent from the following detailed descriptions thereof when taken in connection with the accompanying drawings.

BRIEF DESCRIPTION OF THE DRAWINGS

FIG. 1A illustrates a side view of a vehicle lift gate assembly having a lift gate;

FIG. 1B illustrates a rear view of the vehicle lift gate assembly shown in FIG. 1A;

FIG. 2 illustrates a side view of a vehicle lift gate assembly having a lift gate and a fascia panel thereon with the fascia panel having a capacitance sensor in accordance with an embodiment of the present invention;

FIGS. 7A through 7D illustrate various views of a vehicle keyless entry assembly in accordance with an embodiment of the present invention;

FIG. 13 illustrates a variation of the vehicle keyless entry assembly shown in FIG. 9;

FIG. 14 illustrates another variation of the vehicle keyless entry assembly shown in FIG. 9;

FIGS. 15 and 16 respectively illustrate two different exemplary ways for connecting the vehicle keyless entry assembly shown in FIG. 9 to a PCB;

DETAILED DESCRIPTION OF THE PREFERRED EMBODIMENT(S)

Figures 3A, 3B:
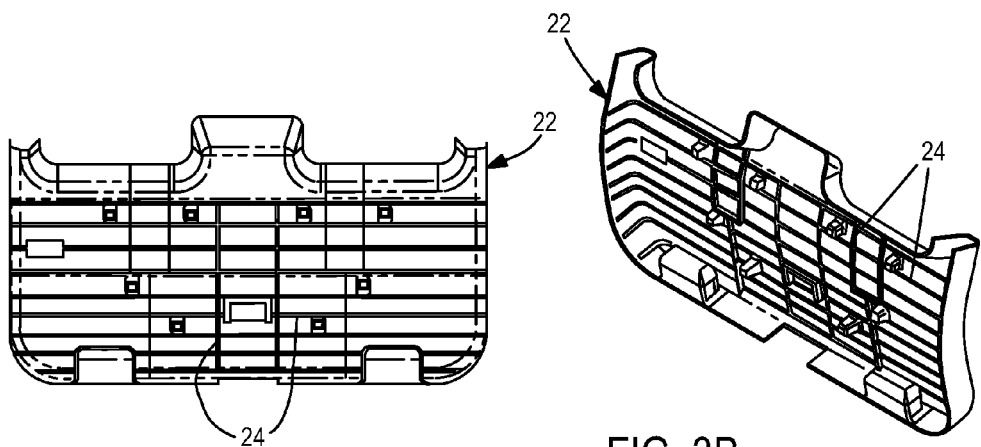
FIG. 3A illustrates an interior view of the fascia panel and the sensor of the vehicle lift gate assembly shown in FIG. 2.
FIG. 3B illustrates an angled interior view of the fascia panel and the sensor of the vehicle lift gate assembly shown in FIG. 2.

Referring now to FIGS. 1A and 1B, a vehicle lift gate assembly 10 having a lift gate 12 is shown. Lift gate 12 is connected by a cylinder 14 or the like to a body panel 16 of a vehicle. Cylinder 14 includes a piston rod which extends to move lift gate 12 to an opened position with respect to body panel 16 and contracts to move lift gate 12 to a closed position with respect to body panel 16 (lift gate 12 in the closed position is shown as a dotted line in FIG. 1A). A capacitance sensor 18 is mounted along body panel 16. Sensor 18 is operable for detecting the presence of an electrically conductive object such as a human body part extending into the opening between lift gate 12 and body panel 16 when the object is proximal to body panel 16.

Sensor 18 is part of an anti-entrapment system which includes a controller. Sensor 18 generally includes separated first and second electrically conductive conductors with a dielectric element therebetween. The conductors are set at different voltage potentials with respect to one another with one of the conductors typically being set at electrical ground. Sensor 18 has an associated capacitance which is a function of the different voltage potentials applied to the conductors. The capacitance of sensor 18 changes in response to the conductors being physically moved relative to one another such as when an object (either electrically conductive or non-conductive) touches sensor 18. Similarly, the capacitance of sensor 18 changes when an electrically conductive object comes into proximity with the conductor of sensor 18 that is not electrically grounded. As such, sensor 18 is operable to detect an object on sensor 18 (i.e., an object touching sensor 18) and/or the presence of an object near sensor 18 (i.e., an object in proximity to sensor 18).

The controller is in communication with sensor 18 to monitor the capacitance of sensor 18. When the capacitance of sensor 18 indicates that an object is near or is touching sensor 18 (i.e., an object is near or is touching vehicle body panel 16 to which sensor 18 is mounted), the controller controls lift gate 12 accordingly via cylinder 14. For instance, the controller controls lift gate 12 to halt movement in the closing direction when sensor 18 detects the presence of an object near sensor 18. In this case, the object may be a human such as a child and the controller halts the closing movement of lift gate 12 to prevent lift gate 12 from closing on the child. In this event, the controller may further control lift gate 12 to cause lift gate 12 to move in the opening direction in order to provide the child with room to move between the vehicle and lift gate 12 if needed. Instead of being mounted on body panel 16 as shown in FIGS. 1A and 1B, sensor 18 can be mounted on a closing member such as lift gate 12 or on any other closure opening where anti-trap is required. That is, sensor 18 can be located on body panel 16 or on a closing member like lift gate 12 or on any closure opening where an anti-trap is desired or required.

Referring now to FIG. 2, with continual reference to FIGS. 1A and 1B, a side view of a vehicle lift gate assembly 20 in accordance with an embodiment of the present invention is shown. Lift gate assembly 20 includes lift gate 12 which is movable between opened and closed positions with respect to vehicle body panel 16. Lift gate assembly 20 includes sensor 18 which is mounted along body panel 16 and is operable for detecting the presence of an electrically conductive object extending into the opening between lift gate 12 and body panel 16 when the object is touching or is proximal to sensor 18.

Lift gate assembly 20 differs from lift gate assembly 10 shown in FIGS. 1A and 1B in that lift gate 12 of lift gate assembly 20 includes an interior fascia panel 22 having a capacitance sensor 24. Fascia panel 22 is mounted to the interior surface of lift gate 12. Sensor 24 is mounted to the interior surface of fascia panel 22 which faces the vehicle interior when lift gate 12 is closed. As such, sensor 24 is between fascia panel 22 and lift gate 12. Alternatively, sensor 24 may be within fascia panel 22 or mounted to an exterior surface of fascia panel 22. That is, sensor 24 can be mounted internal to fascia panel 22 or on the exterior of fascia panel 22.

Like sensor 18, sensor 24 is part of an anti-entrapment system which includes a controller and is operable for detecting the presence of an electrically conductive object such as a human body part in proximity to sensor 24. Sensor 24 includes an electrically conductive conductor like the first conductor of sensor 18, but does not include another conductor like the second conductor of sensor 18. In general, the conductor of sensor 24 (i.e., sensor 24 itself) capacitively couples to an electrically conductive object which is in either proximity to or is touching sensor 24 while sensor 24 is driven with an electrical charge. The controller is in communication with sensor 24 to monitor the capacitive coupling of sensor 24 to the object. The controller determines that an object is in proximity to or is touching sensor 24 (when sensor 24 is exposed to contact) upon detecting the capacitive coupling of sensor 24 to the object. In turn, the controller controls lift gate 12 accordingly.

As sensor 24 is mounted to fascia panel 22 which is mounted to lift gate 12, sensor 24 is operable for detecting the presence of an electrically conductive object extending into the opening between lift gate 12 and the vehicle body when the object is proximal to fascia panel 22 (as opposed to when the object is proximal to vehicle body panel 16 as provided by sensor 18). As such, sensor 24 expands the anti-entrapment capability compared to that of lift gate assembly 10 for detecting the presence of an object in the travel path of lift gate 12. An example is that sensor 24, which is located within fascia panel 22, can detect the presence of a person standing under an open lift gate 12 to thereby prevent fascia panel 22 (and thereby lift gate 12) from contacting the person as lift gate 12 is closing. To this end, when detection occurs, the controller halts downward travel and reverses movement of lift gate 12 back to the opened position. If desired, sensor 24 and the controller can be configured to monitor for a person in close proximity to lift gate 12 to prevent lift gate 12 from opening. For example, this detection prevents a person such as a child from accidentally falling out of the vehicle when lift gate 12 is partially opened. An alternative location for sensor 24 can be along each outer edge of lift gate opening.

Referring now to FIGS. 3A and 3B, with continual reference to FIG. 2, interior views of fascia panel 22 and sensor 24 of vehicle lift gate assembly 20 are shown. As indicated above, sensor 24 is placed on the interior surface of fascia panel 22 which faces the vehicle interior when lift gate 12 is closed. That is, sensor 24 is placed on the interior surface of fascia panel 22 which is farthest from lift gate 12. FIGS. 3A and 3B illustrate this interior surface of fascia panel 22.

As shown in FIGS. 3A and 3B, sensor 24 is formed from an array of electrically conductive strips which are placed vertically and horizontally across the interior surface of fascia panel 22. The strips of sensor 24 are in electrical connectivity to each other and together form the conductor of sensor 24 (i.e., the strips together are sensor 24). The strips of sensor 24 extend across this interior surface of fascia panel 22 following the contour of fascia panel 22. In this embodiment, fascia panel 22 is made of non-conductive plastic material which allows sensor 24 to detect the presence of conductive objects through fascia panel 22.

Sensor 24 can be placed on the external surface of fascia panel 22 which directly faces the vehicle interior when lift gate 12 is closed. However, placement of sensor 24 on the interior surface of fascia panel 22 hides sensor 24 from user view and protects sensor 24 against potential damage. Sensor 24 can also be over-molded on any surface of fascia panel 22 allowing for additional protection from damage caused by assembly or other handling.

The strips of sensor 24 can be configured into other array patterns utilizing angle or curvature combinations that may better optimize object detection objectives. Sensor 24 can be tailored and applied in any deliberate pattern to customize and enhance object detection performance. The distance between each strip is sufficient to provide continuous object detection coverage across the surface of fascia panel 22. Other configurations in place of the strips of sensor 24 include a solid sheet of electrically conductive material such as copper or aluminum foil, a conductive array or screen that is stamped, woven, or braided, multiple conductive decal-like shapes placed about the interior surface of fascia panel 22 and electrically interconnected, etc. The strips of sensor 24 are fabricated from copper, but may be fabricated from other materials including carbon inks, fabrics, plastics, elastomers, or other metals like aluminum, brass, bronze, and the like. There are various known methods to achieve electrical conductivity in fabrics, plastics, and elastomers. The conductive material can be deposited onto the plastic or deposited into a carrier which is then inserted into the mold to form sensor 24.

As indicated above, the strips of sensor 24, which are electrically interconnected to one another, form a conductor which functions like a first conductive plate of a capacitor. Such a capacitor has a second conductive plate with the plates being separated from one another by a material such as a dielectric element. Unlike such a capacitor, sensor 24 is constructed without a second conductive plate and without a second conductive plate electrically connected to ground. Instead, the metal construction of lift gate 12 functions as the second conductive plate and provides shielding of sensor 24 from stray capacitive influence.

Alternatively, sensor 24 can be constructed to use multiple layers of conductors, each separated by a non-conductive material. A ground layer of conductive material placed behind the other layers can be used to provide extra shielding as necessary.

Fascia panel 22 made of a rigid material restricts sensor 24 from detecting electrically non-conductive objects. This is because the rigidness of fascia panel 22 prevents fascia panel 22 from displacing when an object touches fascia panel 22. In turn, sensor 24 is prevented from displacing toward the metal construction of lift gate 12 when the object touches fascia panel 22. As such, any change of the capacitance between sensor 24 and lift gate 12 does not occur as a result of an electrically non-conductive object touching fascia panel 22. For both electrically conductive and non-conductive object modes of detection, sensor 24 may be mounted to the external surface of fascia panel 22. In this case, an object (electrically conductive or non-conductive) touching sensor 24 triggers sensor 24 (i.e., causes a change in capacitance between sensor 24 and the metal construction of lift gate 12) due to sensor 24 compressing (i.e., sensor 24 displacing towards lift gate 12). Likewise, sensor 24 mounted to the internal surface of fascia panel 22 can detect an object touching fascia panel 22 when fascia panel 22 is flexible and/or compressible to the degree required to allow sensor 24 to displace towards lift gate 12.

Figure 4A:
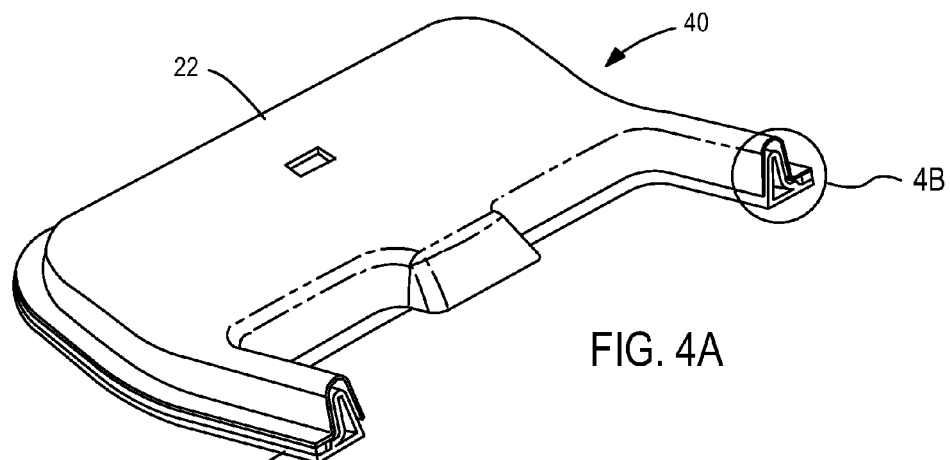
FIG. 4A illustrates a perspective view of a vehicle lift gate assembly having a lift gate and a fascia panel thereon with the fascia panel having a capacitance sensor in accordance with an embodiment of the present invention.
Figure 4B:
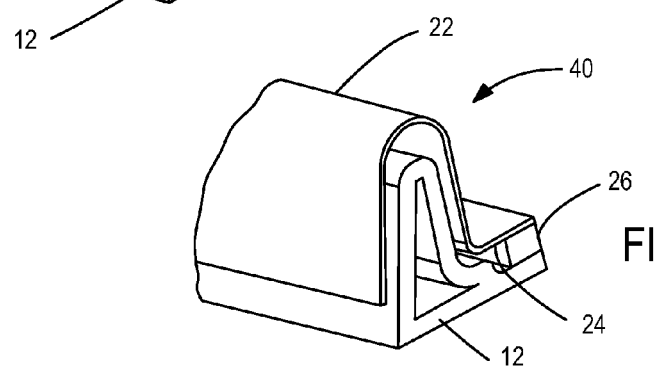
FIG. 4B illustrates the cross-section "4B" of FIG. 4A where the sensor is configured for both electrically conductive and non-conductive object detection.

Referring now to FIGS. 4A and 4B, a vehicle lift gate assembly 40 in accordance with an embodiment of the present invention is shown. Lift gate assembly 40 is similar to lift gate assembly 20 in that lift gate assembly 40 includes a lift gate 12 and a fascia panel 22 thereon with fascia panel 22 having sensor 24. Lift gate assembly 40 is configured differently than lift gate assembly 20 in that a portion of fascia panel 22 of lift gate assembly 40 is configured to enable sensor 24 to perform both electrically conductive and non-conductive object detection near this portion of fascia panel 22. Sensor 24 as shown in FIG. 4B can be separate from the trim panel.

To this end, an element (e.g., a strip) of sensor 24 is positioned on the interior surface of an edge region of fascia panel 22 adjacently along an edge of lift gate 12 and is separated from lift gate 12 by a spacer 26. Spacer 26 is constructed of an electrically non-conductive material and is compressible. As described above, the metal construction of lift gate 12 provides the electrical ground used to shield sensor 24 from stray capacitive influence. This configuration is an example of extending fascia panel 22 to the extreme edges of lift gate 12 to sense the presence of an object in the travel path of lift gate 12 when lift gate 12 closes. Spacer 26 made of a compressible material such as open or closed cell foam rubber or other like materials allows the edge region of sensor 24 (and the edge region of fascia panel 22) to move spatially closer to the metal ground of lift gate 12 upon an object touching the edge region of fascia panel 22. Spacer 26 can be continuous or comprised of smaller sections arranged along the area to be sensed which allows movement of the edge regions of fascia panel 22 and sensor 24 when pressure is applied.

Sensor 24 can detect electrically conductive objects which are in proximity to or touching the edge region of sensor 24 and can detect electrically non-conductive objects which are touching the edge region of sensor 24. In particular, sensor 24 can detect an electrically conductive object proximal to the edge region of sensor 24 due to the capacitive coupling of the edge region of sensor 24 with the object. Sensor 24 can detect an object (electrically conductive or non-conductive) touching the edge region of fascia panel due to the capacitance of sensor 24 with the metal construction of lift gate 12 changing as a result of the edge region of sensor 24 being displaced from the touch in the direction of lift gate 12. Spacer 26 compresses to allow the edge region of sensor 24 to displace towards lift gate 12.

Applications of sensor 24 are not limited to fascia panel 22 of lift gate assemblies 20, 40. Likewise, in addition to detecting the presence of an object for anti-entrapment purposes, sensor 24 can be positioned behind any electrically non-conductive surface and be configured to detect the presence, position, or motion (e.g., gesture) of an electrically conductive object such as a human. Sensor 24 and its controller can serve as an interface between a human user and a vehicle to enable the user to control various vehicle functions requiring human input. The controller can be configured to have sensitivity to detect the position of a person's finger in proximity to sensor 24 prior to carrying out an actual key press or other type of user activation. For example, it may be desired to initiate a sequence of operations by positioning a finger or hand in proximity to a series of sensors 24 ("touch pads") followed by a specific activation command once a sought out function has been located. The initial finger positioning can be to illuminate keypads or the like associated with the series of sensors 24 to a first intensity without activation of a command. As the touch area expands from increased finger pressure, the signal increases thereby allowing the controller to distinguish between positioning and activation command functions. Confirmation of the selection, other than activation of the desired function, can be configured to increase illumination intensity, audible feedback, or tactile feedback such as vibration. Each sensor 24 ("touch area") can have a different audio and feel to differentiate the touch area operation.

Figure 5:
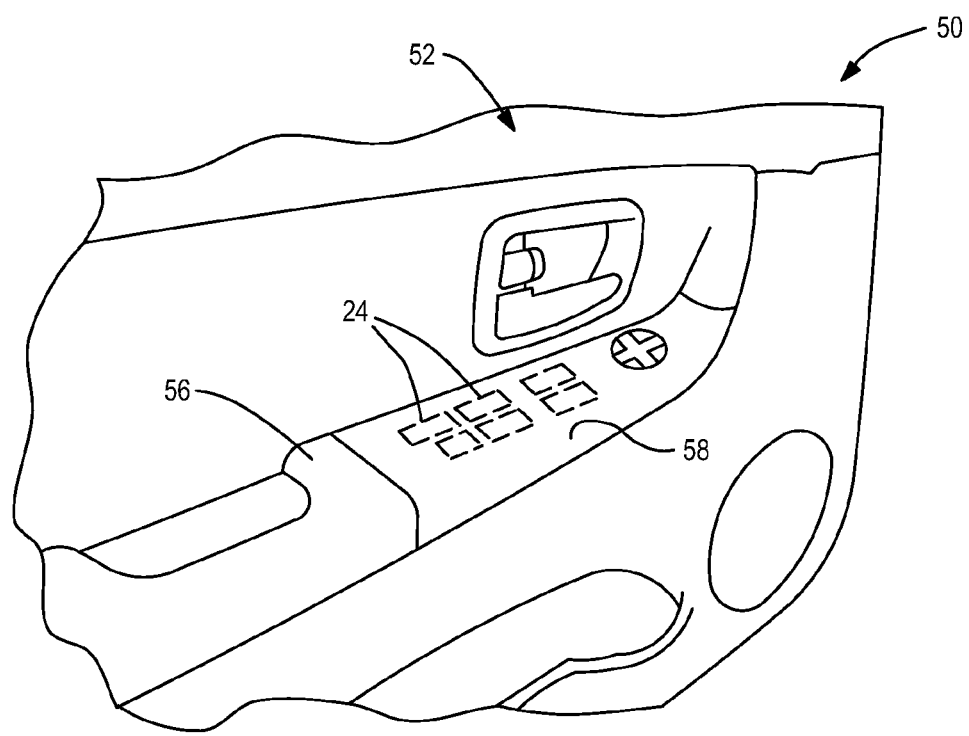
FIG. 5 illustrates a perspective view of a vehicle door assembly having an interior door fascia and capacitance sensors in accordance with an embodiment of the present invention.
Figure 6:
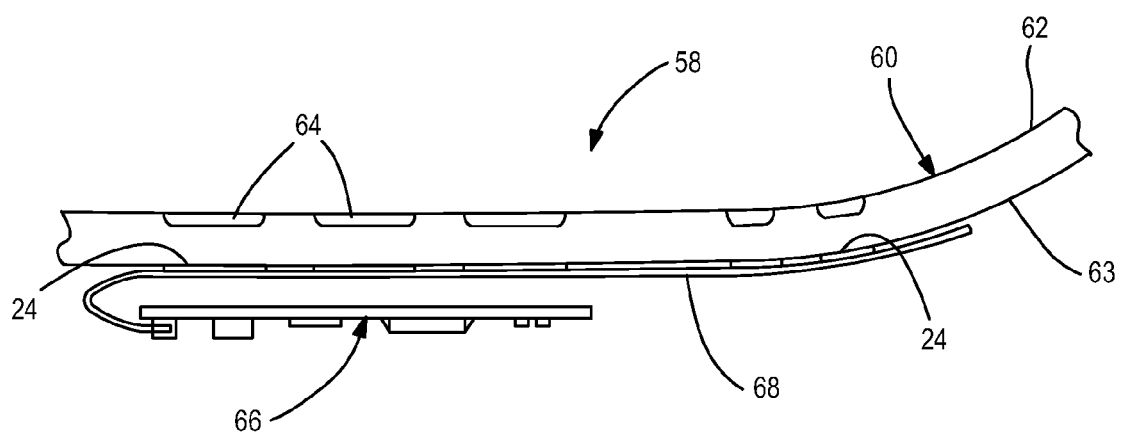
FIG. 6 illustrates a cross-sectional view of the arrangement of the sensors of the vehicle door assembly shown in FIG. 5.

Referring now to FIGS. 5 and 6, a vehicle door assembly 50 in accordance with an embodiment of the present invention will be described. Vehicle door assembly 50 represents an application of sensor 24 to an environment other than vehicle lift gate assemblies. Assembly 50 includes an interior door fascia 52 and a series of sensors 24. FIG. 5 illustrates a perspective view of vehicle door assembly 50 and FIG. 6 illustrates a cross-sectional view of the arrangement of sensors 24.

Sensors 24 of vehicle door assembly 50 are each formed by their own conductor and are not directly electrically connected to one another. As such, each sensor 24 defines a unique touch pad associated with a unique touch area in which object detection of one sensor 24 does not depend on object detection of another sensor 24. Sensors 24 are arranged into an array and function independently of one another like an array of mechanical switches that commonly control vehicle functions like window up and down travel, door locking and unlocking, positioning of side view mirrors, etc.

Interior door fascia 52 includes a pull handle 56 and a faceplate assembly 58 which together create an armrest component of door fascia 52. Sensors 24 are individually attached to the underside of faceplate assembly 58. Each sensor 24 has a sufficient area to detect a human finger proximal to that sensor. Object detection by a sensor 24 occurs when a portion of a user's body such as a hand or finger comes within sensitivity range directly over that sensor 24. By locating multiple sensors 24 on the underside of faceplate assembly 58, a sensor array is created to resemble the array of mechanical switches. Sensors 24 can be configured to have many different kinds of shapes such as raised surfaces or recessed contours to prevent accidental activation. Adding faceplate assembly 58 to the reversing control of a power window reduces complexity and cost associated with mechanical switches and associated wiring. The power window control for up/down can be incorporated into faceplate assembly 58 or the control can be remote if required due to vehicle design and packaging.

Referring briefly back to FIG. 2, a second sensor 24a placed on the external surface of the hatch (i.e., lift gate 12) of the vehicle can be used as an interface to operate the hatch. Additionally, a single controller can be used to interface with both anti-entrapment sensor 24 and hatch operating sensor 24a.

Referring back to FIGS. 5 and 6, faceplate assembly 58 includes a faceplate 60 made of electrically non-conductive material. Faceplate 60 provides support for multiple sensors 24 mounted to its underside (i.e., underside faceplate surface 63) and allows for object detection through its topside (i.e., topside faceplate surface 62). Underside faceplate surface 63 is relatively smooth to permit close mounting of sensors 24 to faceplate 60. However, degrees of roughness can also be configured to function effectively. Topside faceplate surface 62 can have any number of physical features 64 or graphical markings which are respectively associated (e.g., aligned) with sensors 24 in order to assist a user in locating the position of each sensor 24 and identifying the function assigned therewith.

Each sensor 24 is formed as a thin electrically conductive pad mounted firmly to underside faceplate surface 63. Each sensor 24 in this configuration is pliable and can therefore be formed to the contours of the surface of faceplate 60 to which the sensor is attached. An adhesive may be applied between sensors 24 and the surface of faceplate 60 for positioning and support as well as minimizing air gaps between sensors 24 and the faceplate surface. Alternatively, sensors 24 can be molded into faceplate 60 thereby eliminating the need for adhesive or other mechanical attachment. Another alternate is each sensor 24 being arranged as a member mounted directly on a printed circuit board (PCB) 66 (i.e., a controller) and extending up toward, and possibly contacting, underside faceplate surface 63. With this arrangement, sensors 24 can be in direct physical and electrical contact with PCB 66 or in indirect contact with PCB 66 through the use of a joining conductor.

Each sensor 24 can be constructed of an electrically conductive material such as foam, metal, conductive plastic, or a non-conductive element with a conductive coating applied thereon. Materials used to construct sensors 24 should be of a compressible nature to account for tolerance stack-ups that are a normal part of any assembly having more than one component. Sensor compressibility ensures that contact is maintained between faceplate 60 and PCB 66. In the event that faceplate 60 is to be backlit, the use of a light pipe with conductive coating applied could be configured as a sensor 24.

Sensors 24 can be constructed from materials having low electrical resistance such as common metals like copper or aluminum. Other materials exhibiting low electrical resistance such as conductive plastics, epoxies, paints, inks, or metallic coatings can be used. Sensors 24 can be preformed to resemble decals, emblems, stickers, tags, and the like. Sensors 24 can be applied onto surfaces as coatings or etched from plated surfaces. If materials are delicate, then a non-conductive backing 68 such as polyester film, fiberglass, paper, rubber, or the like can support and protect sensors 24 during installation. In applications where multiple sensing areas are required, backing 68 can assist in locating and anchoring sensors 24 to faceplate 60.

With reference to FIG. 6, backing 68 is a flexible circuit having copper pads which make up the touch pads of sensors 24 (i.e., each sensor 24 includes a copper pad). Backing 68 includes separated copper wires electrically connected to respective sensors 24 (shown in FIG. 7B). Backing 68 makes an electrical connection to PCB 66 such that each sensor 24 is electrically connected to the signal conditioning electronics of PCB 66. In an alternate configuration, backing 68 and PCB 66 are combined into a single circuit board containing both the touch pads of sensors 24 and the signal conditioning electronics.

In order to activate a sensor 24, a user applies a finger to the associated marking 64 on the surface of faceplate 60. Electronic signal conditioning circuitry of PCB 66 which is interfaced to sensor 24 then processes the input signal from sensor 24 and completes circuit connections to activate the commanded function. The action is similar to pressing a mechanical switch to complete an electrical circuit.

Placement of sensors 24 behind a non-conductive barrier such as faceplate 60 creates a protective barrier between users and sensors 24 and shields sensors 24 against environmental contaminants. Sensors 24 can be applied to the backside of virtually any non-conductive barrier and preferably are flexible enough to conform to complex geometries where operator switch functions are needed. Sensors 24 can be contoured and configured from more rigid materials if desired. Examples of switch locations in a vehicle are door panels, armrests, dashboards, center consoles, overhead consoles, internal trim panels, exterior door components, and the like. Sensors 24 can be arranged individually or grouped as keypad arrays. Sensors 24 can be arranged into patterns of sequential sensing elements which are either electrically discrete or interconnected to create ergonomically appealing interfaces.

Referring now to FIGS. 7A through 7D, with continual reference to FIGS. 5 and 6, various views of a vehicle keyless entry assembly 70 in accordance with an embodiment of the present invention are shown. Vehicle keyless entry assembly 70 represents an example of an automotive application incorporating sensors 24. Sensors 24 of vehicle keyless entry assembly 70 function as touch pads to activate a vehicle keyless entry. In addition to sensors 24, vehicle keyless entry assembly 70 includes a faceplate 60, a backing 68, and a PCB 66 (i.e., a controller). Sensors 24 with backing 68 are configured as a flexible circuit which uses individual conductive coatings for the touch pads of sensors 24. Backing 68 makes respective electrical connections between sensors 24 and the signal conditioning electronics on PCB 66.

Vehicle keyless entry assembly 70 represents an example of a product requiring backlighting. As such, sensors 24 have to be capable of passing light. Accordingly, faceplate 60 in this configuration is a molded transparent or translucent non-conductive material such as GE Plastics Lexan® 141 grade polycarbonate. Further, PCB 66 has light sources 67 for illumination. Light sources 67 are positioned on respective portions of PCB 66 to be adjacent to corresponding ones of sensors 24. Other resins or materials meeting the application requirements including acceptable light transmittance characteristics can also be used for faceplate 60. Sensors 24 are attached to the underside 68a of backing 68. In turn, the topside 68b of backing 68 is attached to the interior surface of faceplate 60 using adhesive 72. The topside 68b of backing 68 has graphic characters 64 that locate the position of associated sensors 24 and identify the function assigned therewith. Either the underside 68a or the topside 68b of backing 68 has individual traces 74 for making an electrical connection between sensors 24 and PCB 66. Connection between backing 68 and PCB 66 is connected by a flat cable 76 which contains traces 74. This interconnect can be accomplished using other carriers such as individual wires, header style connectors, and the like. In any of the configurations, sensors 24 can be applied directly to the surface which is to be touched for activation. However, sensors 24 are on the backside of the touch surface for protection and wear resistance.

Each sensor 24 of vehicle keyless entry assembly 70 may be made from Indium Tin Oxide (ITO) which is optically transparent and electrically conductive with an electrical resistance measuring sixty ohms/sq. Other electrically conductive materials such as foam, elastomer, plastic, or a nonconductive structure with a conductive coating applied thereon can be used to produce a sensor 24 having transparent or translucent properties and being electrically conductive. Conductive materials that are opaque such as metal, plastic, foam, elastomer, carbon inks, or other coatings can be hollowed to pass light where desired while the remaining perimeter of material acts as sensor 24.

An optically transparent and an electrically conductive sensor 24 made from ITO may create a color shift as light travels through the sensor and through the faceplate to which the sensor is attached. This color shift is a result of the optical quality and reflection of the optical distance between the front ITO surface of the sensor and the rear ITO surface of the sensor. In order to eliminate the light transmission errors between the different ITO layers, a transparent coating is applied on the rear ITO surface to initially bend the light which thereby eliminates the color differential seen on the front surface of the sensor between the front and rear ITO surfaces of the sensor. Additionally, an acrylic coating may be applied on the sensor to provide a layer of protection and durability for exposed ITO.

Turning back to FIG. 2, with continual reference to the other figures, as described above, a second sensor 24a placed on the external surface of a vehicle opening such as a hatch (i.e., lift gate 12) can be used as an interface to operate the vehicle opening. In accordance with an embodiment of the present invention, a keyless entry assembly includes a sensor like any of sensors 24 described herein which is to be placed on the external surface of a vehicle opening and is to be used as an interface to operate (i.e., open and close; unlock and lock) the vehicle opening. As an alternative to being a hatch, the vehicle opening may be a door, a trunk lid, or any other opening of a vehicle and may be of a metal construction. The discussion below will assume that the vehicle opening is a trunk lid and that this keyless entry assembly includes a sensor 24 which is placed on the external side of the trunk lid and arranged behind a non-conductive barrier like faceplate 60.

This keyless entry assembly further includes a controller in addition to sensor 24. The controller is operable to unlock the trunk lid. The controller is in communication with sensor 24 to monitor the capacitance of sensor 24 in order to determine whether an object (including a human user) is touching sensor 24 or whether an electrically conductive object (such as the user) is in proximity to sensor 24. If the controller determines that a user is touching or is in proximity to sensor 24, then the controller deduces that the user is at least in proximity to the trunk lid. Upon deducing that a user is at least in proximity to the trunk lid, the controller controls the trunk lid accordingly. For instance, while the trunk lid is closed and a user touches or comes into proximity to the trunk lid, the controller unlocks the trunk lid. In turn, the user can open the trunk lid (or the trunk lid can be opened automatically) to access the trunk.

As such, this keyless entry assembly can be realized by touch or touchless activation for releasing the trunk lid. An example of touch activation is a user touching sensor 24. An example of touchless activation is a user moving into proximity to sensor 24. As will be described in greater detail below with reference to FIGS. 8A and 8B, another example of touchless activation is a sequence of events taking place such as a user approaching sensor 24 and then stepping away in a certain amount of time.

In either touch or touchless activation, this keyless entry assembly may include a mechanism for detecting the authorization of the user to activate the trunk lid. To this end, the controller is operable for key fob querying and the user is to possess a key fob in order for the controller to determine the authorization of the user in a manner known by those of ordinary skill in the art. That is, the user is to be in at least proximity to the trunk lid and be in possession of an authorized key fob (i.e., the user has to have proper identification) before touch or touchless activation is provided.

For instance, in operation, a user having a key fob approaches a trunk lid on which sensor 24 is placed. The user then touches or comes into proximity to sensor 24. In turn, the controller determines that an object is touching or is in proximity to the trunk lid based on the resulting capacitance of sensor 24. The controller then transmits a key fob query to which the key fob responds. If the response is what the controller expected (i.e., the key fob is an authorized key fob), then the controller unlocks the trunk lid for the user to gain access to the trunk. On the other hand, if there is no response or if the response is not what the controller expected (i.e., the key fob is an unauthorized key fob), then the controller maintains locking of the trunk lid.

Figure 8A:
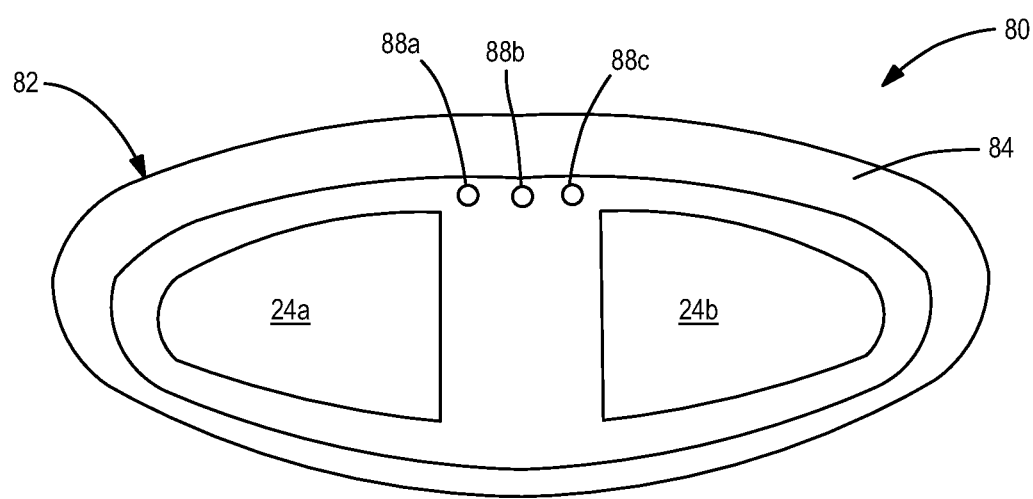
FIGS. 8A and 8B illustrate various views of a vehicle keyless entry assembly in accordance with an embodiment of the present invention.
Figure 8B:
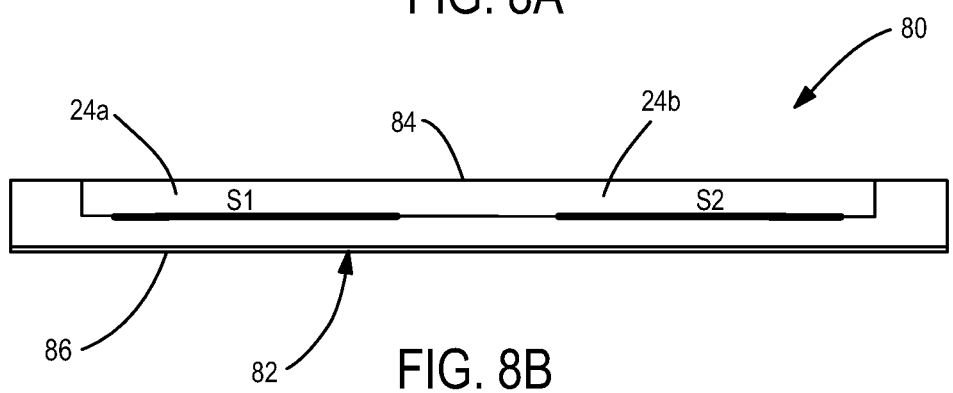

Another feature of this keyless entry assembly, described in greater detail below with reference to FIGS. 8A and 8B, is that sensor 24 may be in the form of an emblem, decal, logo, or the like (e.g., "emblem") in a manner as described herein. Such an emblem (i.e., sensor 24) may represent or identify the vehicle to which sensor 24 is associated. As such, emblem 24 may have different structures, forms, and characteristics depending on manufacturer and model of the vehicle.

Further, sensor 24 of this keyless entry assembly may be capable of passing light in a manner as described herein. Accordingly, this keyless entry assembly may further include a light source, such as any of light sources 67, which is associated with sensor 24. In this event, the controller is operable for controlling the light source in order to illuminate sensor 24 (i.e., illuminate the emblem).

With the above description of this keyless entry assembly in mind, FIGS. 8A and 8B illustrate various views of such a keyless entry assembly 80 in accordance with an embodiment of the present invention.

Keyless entry assembly 80 includes a sensor assembly 82 and a controller (not shown). The controller is in communication with sensor assembly 82 and is operable for controlling vehicle functions such as locking and unlocking a vehicle opening (e.g., a trunk lid of a vehicle). FIG. 8A is a view looking at sensor assembly 82 while sensor assembly 82 is placed on the external surface of the trunk lid. FIG. 8B is a view looking through a cross-section of sensor assembly 82. Sensor assembly 82 includes two sensors (i.e., first sensor 24a and second sensor 24b). First sensor 24a is labeled in FIG. 8B as "S1" and second sensor 24b is labeled in FIG. 8B as "S2". Sensors 24a, 24b are respectively located at different portions of sensor assembly 82. For instance, as shown in FIGS. 8A and 8B, first sensor 24a is at a left-hand side of sensor assembly 82 and second sensor 24b is at a right-hand side of sensor assembly 82.

Sensors 24a, 24b are electrically connected to or associated with a PCB in a manner as described herein. As such, sensors 24a, 24b are not electrically connected to one another. First sensor 24a activates when an object is in proximity to first sensor 24a and second sensor 24b activates when an object is in proximity to second sensor 24b. Similarly, only first sensor 24a activates when an object is in proximity to first sensor 24a and not to second sensor 24b. Likewise, only second sensor 24b activates when an object is in proximity to second sensor 24b and not to first sensor 24a. The activation of a sensor like sensors 24a, 24b depends on the capacitance of the sensor as a result of an object coming into at least proximity with the sensor. For instance, when an object is in proximity to both sensors 24a, 24b and is closer to first sensor 24a than to second sensor 24b, then first sensor 24a will have a stronger activation than second sensor 24b.

Sensor assembly 82 further includes a non-conductive barrier 84 like faceplate 60. Sensors 24a, 24b are mounted to the underside of faceplate 84. Faceplate 84 allows for object detection through its topside. Sensor assembly 82 further includes an overlay 86 positioned over faceplate 84. Overlay 86 is in the shape of an emblem or logo representing the vehicle. In this example, overlay 86 includes two cut-out portions at which sensors 24a, 24b are respectively located. As such, sensors 24a, 24b are patterned to conform to the emblem arrangement of overlay 86.

Keyless entry assembly 80 is an example of the use of sensors (i.e., sensor assembly 82) in conjunction with a controller for operating a trunk lid when a user is in proximity to or is touching sensor assembly 82. As described herein, the operation of the trunk lid may further depend on the authenticity of the user (i.e., whether the user is in possession of an authorized key fob). In the manner described above, sensor assembly 82 can be used to realize either touch or touchless activation for releasing the trunk lid. In terms of touchless activation, sensor assembly 82 represents an example of a hands-free virtual proximity switch.

A particular application of sensor assembly 82 realizing touchless activation involves a sequence of user events taking place relative to sensor assembly 82 in order to control operation of the trunk lid. For instance, the controller of keyless entry assembly 80 may be configured such that a user is required to approach sensor assembly 82 and then step back from sensor assembly 82 in a certain amount of time in order for the controller to unlock the trunk lid. Such a sequence of user events is effectively user body gestures. As such, an expected sequence of user body gestures effectively represents a virtual code for unlocking the trunk lid. That is, the controller controls unlocks the trunk lid in response to a user performing an expected sequence of body gestures in relation to sensor assembly 82. The user may or may not be required to have an authorized key fob depending on whether possession of an authorized key fob is required to unlock the trunk lid.

A more elaborate example of an expected sequence of user body gestures includes the user starting in proximity to sensor assembly 82, then moving backward, then moving left, then moving right, etc. For understanding, another example of an expected sequence of includes the user starting in proximity to sensor assembly 82, then moving away, then moving close, etc. The steps of either sequence may be required to occur within respective time periods. As can be seen, different expected sequences of user body gestures effectively represent different virtual codes for controlling the trunk lid.

Keyless entry assembly 80 provides the user the opportunity to 'personalize' sensor assembly 82 in order to program the controller with the expected sequence of user body gestures that are to be required to control the trunk lid. Personalizing sensor assembly 82 with an expected sequence of user body gestures effectively provides a virtual code to the controller which is to be subsequently entered by the user (by subsequently performing the expected sequence of user body gestures) for the controller to unlock the trunk lid.

The requirement of a sequence of user body gestures, i.e., user body gestures in a certain pattern in a certain amount of time, to take place in order to control operation of the trunk lid is enabled as sensors 24a, 24b activate differently from one another as a function of the proximity of the user to that particular sensor. Again, each sensor 24a, 24b activates when a user is in proximity to that sensor and each sensor 24a, 24b is not activated when a user in not in proximity to that sensor. In the former case, sensors 24a, 24b activate when a user is in proximity to sensors 24a, 24b (which happens when a user steps into proximity of both sensors 24a, 24b). In the latter case, sensors 24a, 24b are not activated when the user is out of proximity to sensors 24a, 24b (which happens when a user steps back far enough away from sensors 24a, 24b).

As further noted above, the amount of activation of a sensor such as sensors 24a, 24b depends on the proximity of a user to the sensor. For instance, first sensor 24a has a stronger activation than second sensor 24b when the user is in closer proximity to first sensor 24a than to second sensor 24b. As such, in this event, the controller determines that the user is closer to first sensor 24a than to second sensor 24b. That is, the controller determines that the user has stepped to the left after the user initially was initially in proximity to sensor assembly 82. Likewise, second sensor 24b has a stronger activation than first sensor 24a when the user is in closer proximity to second sensor 24b than to first sensor 24a. As such, in this event, the controller determines that the user is closer to second sensor 24b than to first sensor 24a. That is, the controller determines that the user has stepped to the right after the user initially was in proximity to sensor assembly 82.

In order to improve this particular application of touchless activation which involves an expected sequence of user body gestures to take place, sensor assembly 82 further includes a plurality of light sources 88 such as light-emitting diodes (LEDs). For instance, as shown in FIG. 8A, sensor assembly 82 includes a first LED 88a, a second LED 88b, and a third LED 88c. LEDs 88 are electrically connected to the PCB to which sensors 24a, 24b are electrically connected. LEDs 88 are mounted to the underside of faceplate 84 where overlay 86 is absent or, alternatively, LEDs 88 are mounted to the underside of faceplate 84 where overlay 86 is present (as shown in FIG. 8A). In either case, faceplate 84 is clear such that light from LEDs 88 can pass through faceplate 84. In the latter case, overlay 86 has cutouts dimensioned to the size of LEDs 88 and LEDs 88 are respectively positioned adjacent to these cutouts such that light from LEDs 88 can pass through faceplate 84 and overlay 86.

The controller is configured to control LEDs 88 to light on or off depending on activation of sensors 24a, 24b. In general, the controller controls LEDs 88 such that: LEDs 88a, 88b, 88c light on when both sensors 24a, 24b are activated; LEDs 88a, 88b, 88c light off when both sensors 24a, 24b are not activated; first LED 88a lights on when first sensor 24a is activated and lights off when first sensor 24a is not activated; and third LED 88c lights on when second sensor 24b is activated and lights off when second sensor 24b is not activated. More specifically, the controller controls LEDs such that: LEDs 88a, 88b, 88c light on when a user is in proximity to both sensors 24a, 24b (which occurs when the user steps close to sensor assembly 82) 24b); LEDs 88a, 88b, 88c light off when the user is out of proximity to both sensors 24a, 24b (which occurs when the user steps far enough back away from sensor assembly 82); first LED 88a lights on and second and third LEDs 88b, 88c light off when the user is in proximity to first sensor 24a and is no closer than tangential proximity to second sensor 24b (which occurs when the user steps to the left while in proximity to sensor assembly 82); and third LED 88c lights on and first and second LEDs 88a, 88b light off when the user is in proximity to second sensor 24b and is no closer than tangential proximity to first sensor 24a (which occurs when the user steps to the right while in proximity to sensor assembly 82).

Accordingly, the user can use the lighting of LEDs 88a, 88b, 88c as feedback when performing a sequence of user body gestures relative to sensor assembly 82 in order to either program (personalize) sensor assembly 82 with the sequence of user body gestures or to unlock the trunk lid by performing the sequence of user body gestures.

Figure 9:
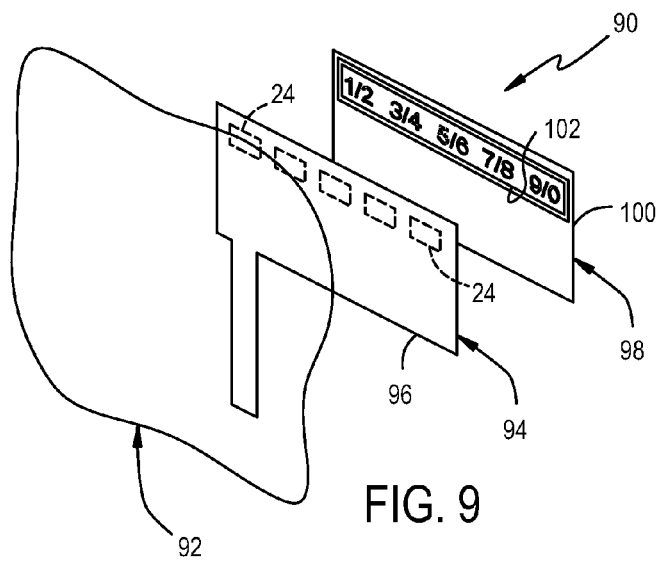
FIG. 9 illustrates a vehicle keyless entry assembly in accordance with another embodiment of the present invention.

Referring now to FIG. 9, with continual reference to FIGS. 5 and 6 and FIGS. 7A through 7D, a vehicle keyless entry assembly 90 in accordance with another embodiment of the present invention is shown. Keyless entry assembly 90 is for use with a user accessible vehicle part such as a window, door handle, etc. As an example, the user accessible vehicle part will be illustrated as a vehicle window 92.

Keyless entry assembly 90 includes a sensor assembly 94. Sensor assembly 94 includes sensors 24. In this example, sensor assembly 94 includes five sensors 24 just like vehicle keyless entry assembly 70 shown in FIGS. 7A through 7D. Sensors 24 are electrically isolated from one another and function as touch pads to activate a keyless entry function as generally described herein and as described with reference to FIGS. 7A through 7D.

Sensor assembly 94 further includes an electrically non-conductive carrier 96 such as a plastic film. Sensors 24 are applied to a surface of carrier 96. As indicated by the dotted lines in FIG. 9, sensors 24 are applied to the rear surface of carrier 96 as the front surface of the carrier is to be applied to window 92. (As an alternate embodiment, sensors 24 are applied to the front surface of carrier 96.) Carrier 96 includes electrically isolated metal wires which are electrically connected to respective sensors 24. (The wires are not shown, but may be understood with reference to FIG. 7B.) The wires of carrier 96 make an electrical connection to a PCB or the like such that each sensor 24 is individually electrically connected to the PCB.

In one embodiment, sensors 24 are made from Indium Tin Oxide (ITO). ITO is useful as it has the appropriate electrical properties for sensing functions as described herein and has appropriate optical properties for applications requiring illumination. In the case of sensors 24 being made from ITO, the sensors may be applied directly to the glass of window 92 instead of to carrier 96. Likewise, ITO sensors 24 may be applied directly to the mirror, plastic, etc., forming the corresponding user accessible vehicle part.

Figure 10:
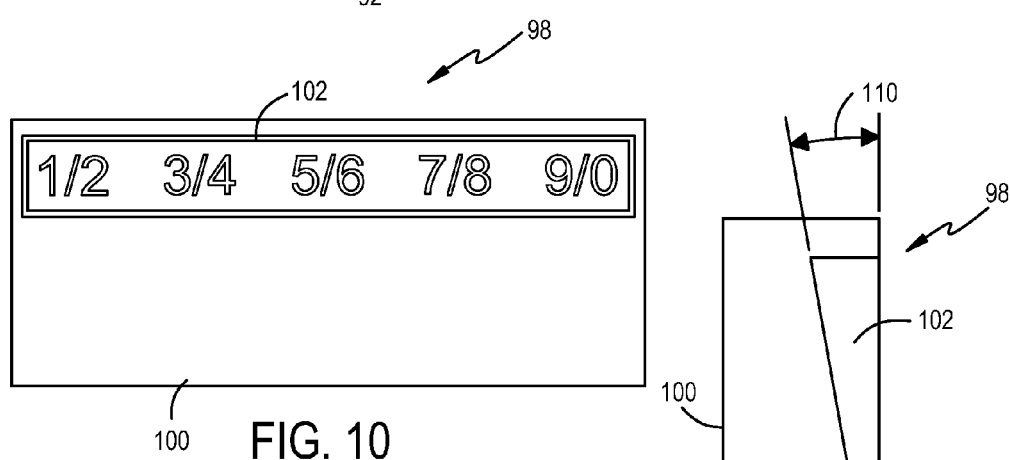
FIG. 10 illustrates an enlarged view of the light pipe assembly of the vehicle keyless entry assembly shown in FIG. 9.

As noted, ITO sensors 24 are appropriate for applications requiring illumination. In furtherance of this objective, keyless entry assembly 90 further includes a light pipe assembly 98 to be used for illumination. FIG. 10 illustrates an enlarged view of light pipe assembly 98. Light pipe assembly 98 includes a body portion 100 and a button indicator 102. Body portion 100 may be in the form of plastic, glass, mirror, or other medium capable of conducting light. In one embodiment, body portion 100 is in the form of a film that is capable of conducting light. Button indicator 102 is directly built into the plastic, glass, mirror, etc. making up body portion 100. Button indicator 102 includes graphic markings that respectively correspond with sensors 24. The graphic markings of button indicator 102 locate the position of the associated sensors 24 and identify the functions assigned therewith. In the assembled stage of keyless entry assembly 90, light pipe assembly 90 is attached to the rear surface of carrier 96 and the front surface of the carrier is attached to window 92.

Figure 11A:
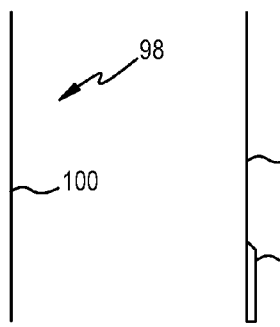
FIGS. 11A, 11B, and 11C respectively illustrate cross-sectional views of the body portion of the light pipe assembly of the vehicle keyless entry assembly shown in FIG. 9.
Figure 11B:
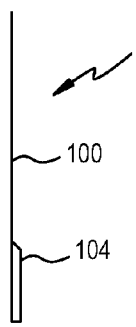
Figure 11C:
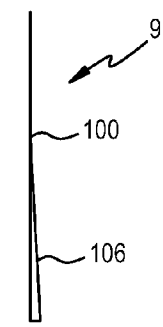

FIGS. 11A, 11B, and 11C respectively illustrate cross-sectional views of body portion 100 of light pipe assembly 98 according to three different variations. In the first variation, body portion 100 has a uniform thickness as shown in FIG. 11A. In the second variation, body portion 100 has a thickened light piping portion 104 where light is to be applied. In the third variation, body portion 100 has a different thickened light piping portion 106 where light is to be applied.

Figure 12:
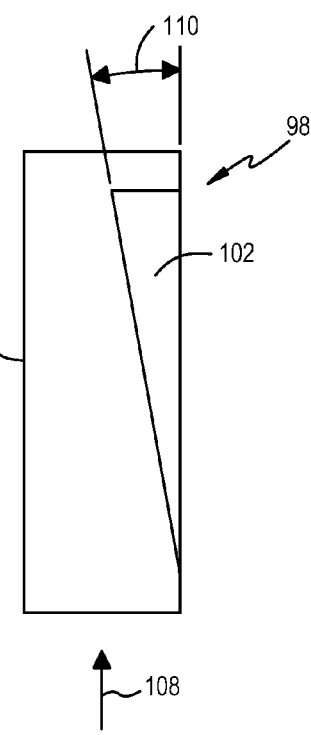
FIG. 12 illustrates etching of the button indicator into the body portion of the light pipe assembly of the vehicle keyless entry assembly shown in FIG. 9.

Uniform illumination of button indicator 102 of light pipe assembly 98 is an important aesthetic feature. With reference to FIG. 12, button indicator 102 may be etched, machined, or the like into body portion 100 of light pipe assembly 98 in order to be illuminated with light 108 from a light source. In order to obtain uniform lighting, button indicator 102 may be etched at an appropriate angle (e.g., etch depth angle 110). As a result of being etched at an appropriate angle, all areas of the markings of button indicator 102 are illuminated as the lower sections of the markings of button indicator 102 do not block light 108 from illuminating the upper sections of the markings of the button indicator. The etching may be done on the rear side of body portion 100 so that the attachment between light pipe assembly 98 and carrier 96 (such as via a liquid adhesive) does not affect the conductance of light 108.

FIG. 13 illustrates a variation of keyless entry assembly 90. In this variation, sensors 24 along with the corresponding electrical connections which are to connect with a PCB are combined with light pipe assembly 98 such that carrier 96 is eliminated. As indicated by the dotted lines in FIG. 13, sensors 24 are applied to the rear surface of body portion 100 of light pipe assembly 98 adjacent to button indicator 102 of light pipe assembly 98.

The lighting of light pipe assembly 98 may occur at any point within body portion 100 that is useful such as through a slot 111 in the middle portion of body portion 100 as shown in FIG. 14.

Figure 16:
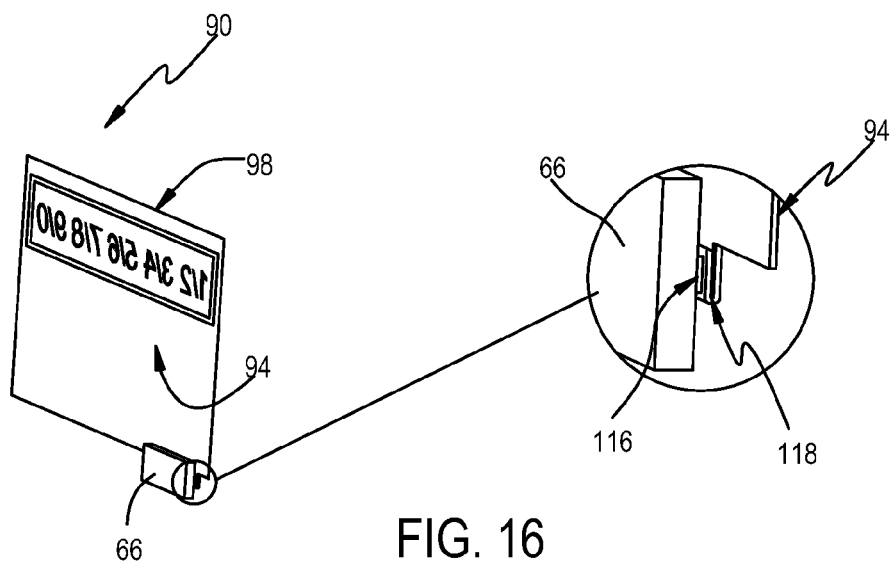

Referring now to FIGS. 15 and 16, with continual reference to FIG. 9, two different exemplary ways for connecting keyless entry assembly 90 to a PCB 66 will be described. Initially, it is noted that as indicated in FIGS. 15 and 16, sensor assembly 94 (comprised of sensors 24 and carrier 96) and light pipe assembly 98 are attached to one another to thereby form keyless entry assembly 90.

As shown in FIG. 15, a connection strip 112 has electrically conductive pads 114. Conductive pads 114 are to be respectively electrically connected with the corresponding metal conductors of carrier 96 of sensor assembly 94. Conductive pads 114 electrically connect sensor assembly 94 to PCB 66. In making such electrical connection between sensor assembly 94 and PCB 66, conductive pads 114 may be used in conjunction with an electrically conductive compressible material 116 or a mechanical connection shown in carrier 96 as a pigtail connection.

As shown in FIG. 16, an end portion 118 of sensor assembly 94 is folded back onto itself. The corresponding conductors of carrier 96 of sensor assembly 94 at folded end portion 118 electrically connect with PCB 66 in order to electrically connect sensor assembly 94 to the PCB. Again, in making such electrical connection between sensor assembly 94 and PCB 66, folded end portion 118 of sensor assembly 94 may be used in conjunction with an electrically conductive compressible material 116.

Figure 17:
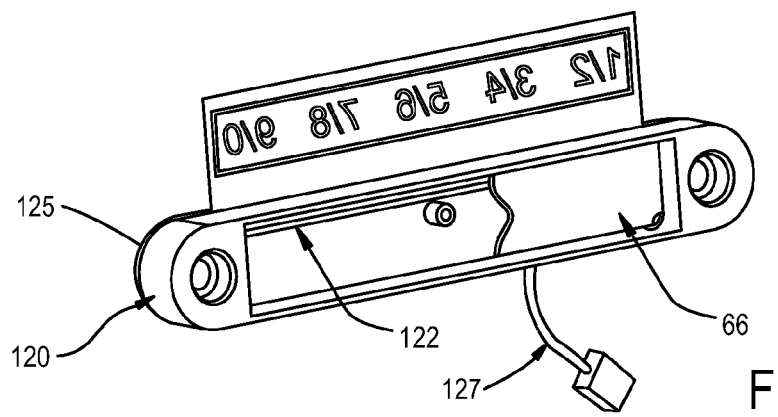
FIG. 17 illustrates an alternate variation of the light pipe assembly of the vehicle keyless entry assembly shown in FIG. 9.

FIG. 17 illustrates an alternate variation of film-type light pipe assembly 98. As shown, this variation entails replacing light pipe assembly 98 with a light pipe having an integrated housing 120. This enables a light pipe detail 122 to simplify the position and placement of illumination device(s), such as LED(s), on PCB 66. A seal 125 is provided to prevent fluid entrance into the electronics and between light pipe assembly 98 to housing 120 and/or between housing 120 and vehicle window 92.

Connection is made from window 92 by a harness. For windows 92 that are movable, a harness 127 is provided for attachment between the vehicle and the glass.

Figure 18:
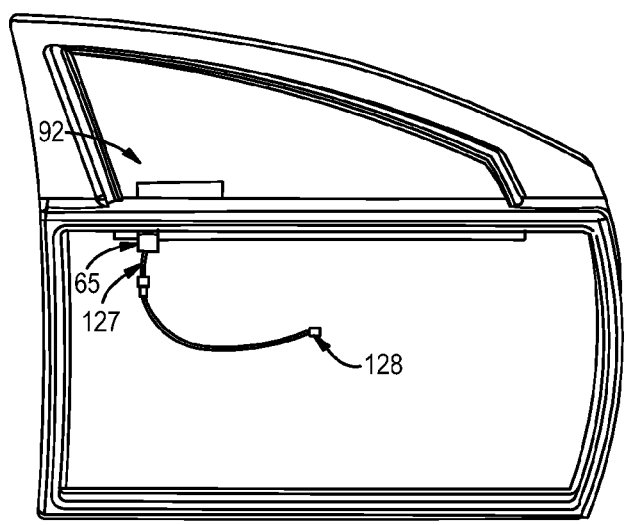
FIG. 18 illustrates connection of the alternative vehicle keyless entry assembly variation shown in FIG. 17 to a vehicle structure

As shown in FIG. 18, a movable harness is attached between electronic module 65 and door frame fasteners 128 which provide strength to prevent damage to the harness. The harness can be made of a ribbon type or wire in a guide that is flexible for protecting the wire.

Figure 19:
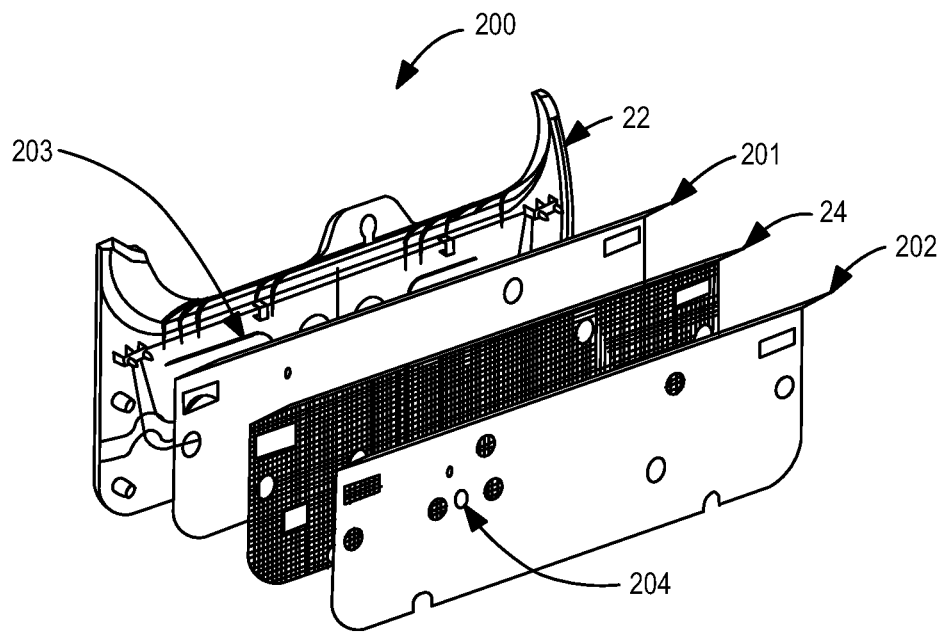
FIG. 19 illustrates an exploded view of a fascia panel assembly in accordance with another embodiment of the present invention.
Figure 20:
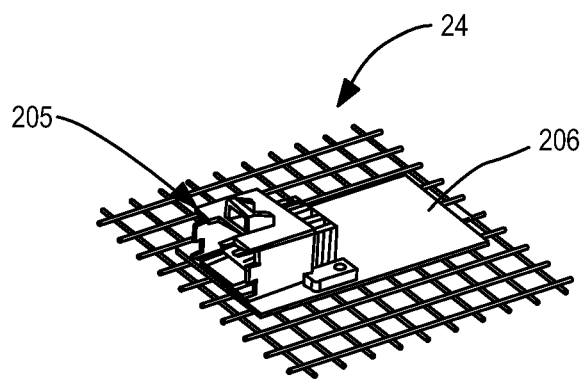
FIG. 20 illustrates a portion of the sensor of the fascia panel assembly shown in FIG. 19.

Referring now to FIGS. 19 and 20, with continual reference to FIGS. 2, 3A, and 3B, a fascia panel assembly 200 in accordance with another embodiment of the present invention will be described. FIG. 19 illustrates an exploded view of fascia panel assembly 200. Fascia panel assembly 200 includes a fascia panel 22, a sensor 24, and first and second non-electrically conductive isolators 201 and 202. FIG. 20 illustrates a portion of sensor 24 of fascia panel assembly 200.

As background, FIG. 2 illustrates a vehicle lift gate assembly 20 having a movable lift gate 12 that includes a fascia panel 22 having a sensor 24 associated therewith. FIGS. 3A and 3B illustrate interior views of fascia panel 22 and sensor 24. As shown in FIGS. 3A and 3B, sensor 24 is formed from an array of electrically conductive strips which are placed vertically and horizontally across the interior surface of fascia panel 22. The strips of sensor 24 are in electrical connectively to each other and together form the conductor of sensor 24 (i.e., as noted above, the strips together are sensor 24).

Fascia panel assembly 200 shown in FIG. 19 is an alternative to the fascia panel and sensor combination shown in FIGS. 3A and 3B. Fascia panel assembly 200 may be part of a movable lift of a vehicle lift gate assembly or may be associated with a totally different component.

As indicated in FIGS. 19 and 20, sensor 24 of fascia panel assembly 200 is formed from an array of vertically and horizontally extending electrically conductive strips. The strips of sensor 24 are in electrical connectively to each other and together form sensor 24. However, sensor 24 may any of a number of forms. For instance, sensor 24 may be any conductive material that can be formed to fit behind fascia panel 22. Sensor 24 can be made of welded steel mesh.

As indicated in FIG. 19, first isolator 201 is positioned between fascia panel 22 and sensor 24 and sensor 24 is posited between first and second isolator 202.

As such, fascia panel 22 and sensor 24 sandwich first isolator 201 and first and second isolators 201 and 202 sandwich sensor 24. To this end, isolators 201 and 202 isolate sensor 24 from fascia panel 22 as well as to isolate sensor 24 from vehicle interior features. Isolators 201 and 202 can be configured to provide sound attenuation at desired frequencies. Further, in the case of fascia panel 22 being flexible, first isolator 201 may also be flexible such that fascia panel 22 and first isolator 201 displace when an object is touching the fascia panel 22 and thereby cause sensor 24 to displace.

Sensor 24 may be adhesively bonded between isolators 201 and 202 for one piece assembly. Sensor 24 may be composed of a conductive fabric and attached to fascia panel 22 or either of isolators 201 and 202. Sensor 24 may be composed of conductive paint or conductive ink and applied to fascia panel 22 or either of isolators 201 and 202. Sensor 24 can formed as one or more electrical conductors on a substrate such as metallization on a plastic film.

Second isolator 202 may be a thick foam and compressed between vehicle body panels and the combination of fascia panel 22, sensor 24, and first isolator 201 in order to hold sensor 24 and first isolator 201 in position.

As shown in FIG. 19, fascia panel 22 may include a stud 203. Stud 203 may be used in conjunction with corresponding holes or pockets of any one of first isolator 201, sensor 24, and second isolator 202 in order to position sensor 24. Similarly, stud 203 may be used to retain first isolator 201, sensor 24, and second isolator 202. To this end, the common manufacturing process known as heat-staking may be employed. Stud 203 may be used for a fastener for retention with the use of a hardware retention element 204 such as a speed nut, screw, bolt, nut, etc.

As indicated above, FIG. 20 illustrates a portion of sensor 24 of fascia panel assembly 200. This portion of sensor 24 includes a printed circuit board (i.e., a controller) 206 having a connector 205. As such, electrical connection to sensor 24 may be performed by selective soldering of relatively small PCB 206 with appropriate connector 205 as shown in FIG. 20.

While embodiments of the present invention have been illustrated and described, it is not intended that these embodiments illustrate and describe all possible forms of the present invention. Rather, the words used in the specification are words of description rather than limitation, and it is understood that various changes may be made without departing from the spirit and scope of the present invention.

What is claimed is:

1. An assembly comprising:
an electrically non-conductive isolator mountable to a flexible fascia panel; and
a capacitance sensor attached to the isolator, wherein the sensor capacitively couples to an electrically conductive object proximal to the sensor while the sensor is driven with an electrical charge such that capacitance of the sensor changes due to the sensor capacitively coupling with the object;
wherein the isolator is flexible such that in response to the fascia panel displacing upon an object touching the fascia panel the isolator also displaces to thereby cause the sensor to displace, wherein the capacitance of the sensor changes due to the displacement of the sensor.

2. The assembly of claim 1 further comprising:
a controller for driving the sensor with the electrical charge and for measuring the capacitance of the sensor to determine whether an electrically conductive object is proximal to the sensor.

3. The assembly of claim 2 wherein:
the controller is operable with a movable device to control movement of the device as a function of the capacitance of the sensor.

4. The assembly of claim 1 wherein:
the sensor includes a plurality of electrically connected electrical conductors.

5. The assembly of claim 1 wherein:
the sensor includes a formable electrically conductive metal.

6. The assembly of claim 1 wherein:
the sensor includes at least one of an electrically conductive fabric, an electrically conductive paint, and an electrically conductive ink.

7. The assembly of claim 1 further comprising:
a printed circuit board having an electrical connector;
wherein the printed circuit board is soldered to the sensor.

8. The assembly of claim 1 wherein:
the sensor includes metalization applied on a carrier film.

9. The assembly of claim 1 wherein:
the isolator minimizes noise and vibration emanating from the sensor.

10. The assembly of claim 1 further comprising:
a second electrically non-conductive isolator;
wherein the sensor is sandwiched between the first and second isolators.

11. A fascia panel assembly comprising:
a fascia panel;
an electrically non-conductive isolator; and
a capacitance sensor which capacitively couples to an electrically conductive object proximal to the sensor while the sensor is driven with an electrical charge such that capacitance of the sensor changes due to the sensor capacitively coupling with the object;
wherein the isolator is sandwiched between the fascia panel and the sensor;
wherein the fascia panel and the isolator are flexible such that the fascia panel and the isolator displace upon an object touching the fascia panel thereby causing the sensor to displace, wherein the capacitance of the sensor changes due to the displacement of the sensor.

12. The assembly of claim 11 wherein:
a controller for driving the sensor with the electrical charge and for measuring the capacitance of the sensor to determine whether an electrically conductive object is proximal to the sensor.

13. The assembly of claim 11 further comprising:
a second electrically non-conductive isolator;
wherein the sensor is sandwiched between the isolators.

14. The assembly of claim 13 wherein:
the sensor is bonded to the isolators.

15. The assembly of claim 13 wherein:
the second isolator includes a compressed thick foam configured to hold the sensor in place.

16. The assembly of claim 11 wherein:
the fascia panel includes a stud;
wherein the isolator is heat-staked to the fascia panel via the stud.

17. The assembly of claim 11 wherein:
the fascia panel includes a stud;
wherein the isolator and the sensor are heat-staked to the fascia panel via the stud.

18. The assembly of claim 11 wherein:
the fascia panel includes a stud;
wherein the isolator includes a receiving portion for the stud;
wherein the stud extends through the receiving portion of the isolator and interacts with a fastener such that the isolator attaches to the fascia panel.

19. The assembly of claim 11 wherein:
the fascia panel includes a stud;
wherein the isolator and the sensor include corresponding receiving portions for the stud;
wherein the stud extends through the receiving portions of the isolator and the sensor and interacts with a fastener such that the isolator and the sensor attach to the fascia panel.

* * * * *